United States Patent
Zivkovic et al.

(10) Patent No.: US 8,566,656 B2
(45) Date of Patent: Oct. 22, 2013

(54) TESTING CIRCUIT AND METHOD

(75) Inventors: Vladimir Aleksandar Zivkovic, 'S-Hertogenbosch (NL); Frank van der Heijden, Eindhoven (NL); Geert Seuren, Roggel (NL); Steven Oostdijk, Albasserdam (NL); Mario Konijnenburg, Best (NL)

(73) Assignee: NXP B.V., Eindhoven (NL)

( * ) Notice: Subject to any disclaimer, the term of this patent is extended or adjusted under 35 U.S.C. 154(b) by 661 days.

(21) Appl. No.: 12/645,175

(22) Filed: Dec. 22, 2009

(65) Prior Publication Data
US 2011/0148445 A1  Jun. 23, 2011

(51) Int. Cl.
*G01R 31/28* (2006.01)

(52) U.S. Cl.
USPC .......................................................... 714/726

(58) Field of Classification Search
USPC .............................. 714/726, 724, 727, 729, 30
See application file for complete search history.

(56) References Cited

U.S. PATENT DOCUMENTS

| | | | |
|---|---|---|---|
| 6,408,412 B1 * | 6/2002 | Rajsuman | 714/724 |
| 6,430,718 B1 * | 8/2002 | Nayak | 714/727 |
| 7,024,346 B1 * | 4/2006 | Allard | 703/14 |
| 7,139,953 B2 | 11/2006 | Hapke | |
| 7,409,612 B2 * | 8/2008 | Van De Logt et al. | 714/727 |
| 7,941,717 B2 * | 5/2011 | Waayers | 714/727 |
| 7,945,834 B2 * | 5/2011 | Waayers et al. | 714/729 |
| 2002/0162063 A1 * | 10/2002 | Whetsel | 714/724 |
| 2005/0005217 A1 | 1/2005 | Whetsel | |
| 2005/0050414 A1 * | 3/2005 | Whetsel | 714/724 |
| 2011/0307750 A1 * | 12/2011 | Narayanan et al. | 714/729 |

FOREIGN PATENT DOCUMENTS

WO   99/15909   4/1999

OTHER PUBLICATIONS

European Search Report (EP 10 19 6141) Apr. 1, 2011 pp. 7.
J. Verfaillie, D. Haspelslagh, "A General-Purpose Design-for-Test Methodology at the Analog-Digital Boundary of Mixed-Signal VLSI," Journal of Electronic Testing: Theory and Application, vol. 9, 1996, pp. 109-115.
G. Seuren, T. Waayers, "Extending the Digital Core-Based Test Methodology to Support Mixed-Signal," Proc. of IEEE International Test Conference (ITC), Oct. 2004, paper No. 10.4.
A. Sehgal et al, "Test Planning for Mixed-Signal SoCs with Wrapped Analogue Cores," Proc. of IEEE Conference on Design, Automation and Test in Europe (Date) 2005, pp. 50-55.
Ren Xiaojun et al: "An Bidirectional IP Wrapper Design for SoC DFT", A High Density Microsystem Design and Packaging and Component Failure Analysis, 2005 Conference on, IEEE, PI, Jun. 1, 2005, pp. 1-5, XP031019723, ISBN: 978-0-7803-9292-2.

(Continued)

*Primary Examiner* — Phung M Chung

(57) ABSTRACT

A test interface circuit operates with different types of core circuits. As consistent with various embodiments, the test interface circuit includes a test input register (TIR) configured to select an operating mode and a plurality of test point registers (TPRs). Each TPR is configured to control signals passed from the input port to a mixed-signal core circuit, responsive to the received test input signals and the operating mode selected by a TIR. In a static mode, each TPR provides serial access to digital inputs and outputs of a mixed-signal core circuit. In a bypass mode, each TPR bypasses TPR slices to preserve test time in response to the TPR being chained to other ones of the TPRs during integration of at least two mixed-signal cores.

19 Claims, 11 Drawing Sheets

(56) References Cited

OTHER PUBLICATIONS

V.A. Zivkovic, J. Schat, G. Seuren, F. van der Heyden, "A Generic Infrastructure for Testing SoC's with Mixed-Signal/RF Modules," Proc. of 12-th IEEE International Mixed Signal Testing Workshop (IMSTW), Jun. 21-23, 2006, Edinburgh, UK, pp. 90-95.

Vladimir A Zivkovic et al: "Core-Based Testing of Embedded Mixed-Signal Modules ina SoC", IEEE Design & Test of Computers, IEEE Service Center, New York, Ny, US, vol. 26, No. 3, May 1, 2009, pp. 78-86, XP011264370, ISSN: 0740-7475.

Medea+, "NanoTEST 2A702 Summary Technical Report H2/2006," p. 20, Feb. 2007.

IEEE Std. 1149.4-1999, "IEEE Standard for a Mixed-Signal Test Bus", Test Technology Technical Committee of the IEEE Computer Society.

1500 IEEE Standard Testability Method for Embedded Core-based Integrated Circuits, Test Technology Technical Committee of the IEEE Computer Society.

IEEE Std. 1149.1-2001, "IEEE Standard Test Access Port and Boundary-Scan Architecture", IEEE Computer Society.

UM10204 0 I2C Standard., NXP Semiconductors of Eindhoven, The Netherlands, version 3.0, Jun. 2007.

* cited by examiner

TESTING CIRCUIT AND METHOD

The present invention relates generally to testing circuitry and related methods, and more specifically to a test circuit and method for testing, operable with different circuit designs.

A variety of testing circuits and related functions have been used for designing and testing integrated circuits, such as reusable cores (e.g., IPs, modules), to create entire system-on-chip (SoC) designs. Core-based design and testing of mixed-signal cores has become increasingly important.

The IEEE 1149.4 standard provides an analog infrastructure to access analog IC pins at the board test, but can also be used to access on-chip nodes, which is applicable to the domain of mixed-signal testing (see IEEE Std. 1149.4-1999, *Test Technology Technical Committee of the IEEE Computer Society*, "IEEE Standard for a Mixed-Signal Test Bus", which is fully incorporated herein by reference).

Certain general purpose design for test (DfT) solutions have been generally limited in their abilities as relative to core-based testing, block isolation, and block interconnection. Attempts at testing SoC designs with mixed-signal blocks have often required DfT insertion at analogue signal paths, which can cause issues (e.g., with RF blocks).

These and other issues continue to present challenges to circuit testing and analysis.

The present invention is exemplified in a number of implementations and applications, some of which are summarized below.

Consistent with an example embodiment of the present invention, a test interface circuit operates with different types of core circuits. The test interface circuit includes an input port configured to receive test input signals, a test input register (TIR) configured to select an operating mode, and a plurality of test point registers (TPRs). Each TPR is configured to control signals passed from the input port to a mixed-signal core circuit, responsive to the received test input signals and the operating mode selected by a TIR. In a static mode, each TPR provides serial access to digital inputs and outputs of a mixed-signal core circuit. In a bypass mode, each TPR bypasses slices to preserve test time in response to the TPR being chained to other ones of the TPRs during integration of at least two mixed-signal cores.

In certain embodiments, the test interface circuit is configured to provide different test signals to different core circuits, via different TPRs. These varied test signals may, for example, be provided simultaneously.

In other embodiments, the test interface circuit is configured to operate in a dynamic mode, to control signals passed to a mixed-signal core circuit by providing dynamic access to connect the input and output ports of the mixed-signal core circuit through additional ports at the boundary of the TPR register.

Another example embodiment is directed to a test point register circuit that includes a plurality of slice circuits (slices), bypass and shift multiplexers and a flip-flop. The slice circuits include an input dynamic slice circuit that receives a test input signal, an output dynamic slice circuit coupled to receive an output from the input dynamic slice circuit, an input static slice circuit coupled to receive an output from the output dynamic slice circuit, and an output static slice circuit coupled to receive an output of the input static slice circuit. The bypass multiplexer is coupled to receive the test input signal and an output of the output static slice circuit as inputs, and is configured to selectively pass one of the inputs in response to a bypass control signal. The shift multiplexer is coupled to receive an output of the bypass multiplexer and a test data output of the test point register as inputs, and to selectively pass one of the inputs in response to a shift control signal. The flip-flop is coupled to receive an output of the shift multiplexer, to provide an output of the TPR circuit, and to provide the output as a feedback input to the shift multiplexer.

Other example embodiments are directed to methods of testing circuits and operating test circuitry, in accordance with one or more approaches as discussed herein.

The above summary is not intended to describe each embodiment or every implementation of the present disclosure. The figures and detailed description that follow more particularly exemplify various embodiments.

The invention may be more completely understood in consideration of the following detailed description of various embodiments of the invention in connection with the accompanying drawings, in which.

Figure 1A:
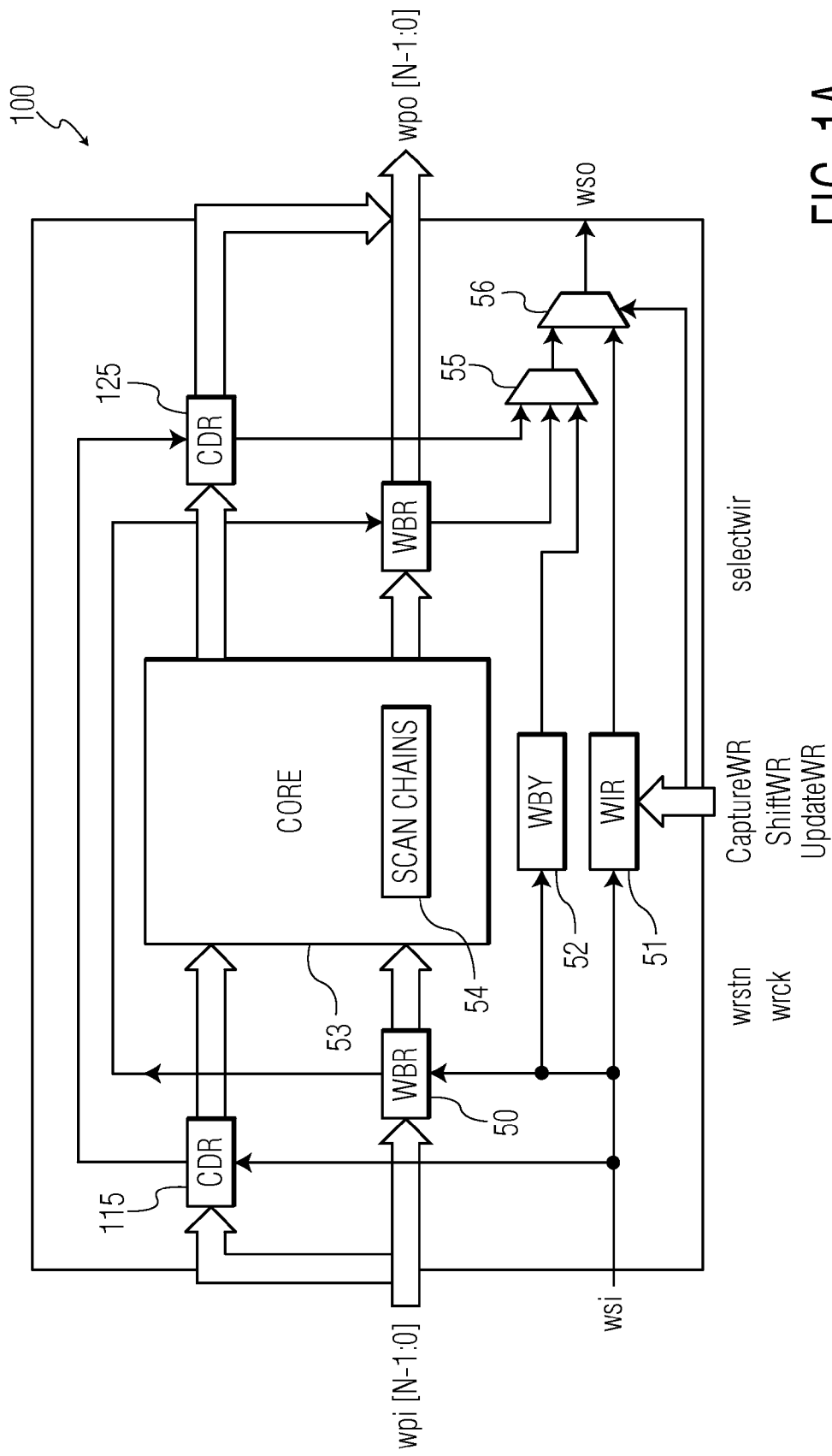
FIG. 1A shows a circuit arrangement with a testing circuit implemented with core data registers (CDRs), in accordance with another example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

The present invention is believed to be applicable to a variety of different types of processes, devices and arrangements for use with circuit-based testing and related interfaces. While the present invention is not necessarily so limited, various aspects of the invention may be appreciated through a discussion of examples using this context.

In connection with various example embodiments, a core-based testing circuit (and design) is configured for implementation with reusable and/or different types of cores (e.g., circuits or modules), facilitating the creation of an entire system-on-chip (SoC) in a short time frame. The testing circuit is configured to operate with a variety of types of interoperable cores, as a standardized interface that operates at different levels including test levels. In connection with various implementations, the circuit architecture is IEEE 1500 standard compliant and is capable to provide the test access to digital ports of (re)usable embedded mixed-signal cores as well as to enable their smooth transfer from one SoC environment to another (see 1500 IEEE Standard Testability Method for Embedded Core-based Integrated Circuits, *Test Technology Technical Committee of the IEEE Computer Society*, which is fully incorporated herein by reference).

In connection with various example embodiments, a testing architecture as described herein is configurable in at least three different configurations for mixed-signal testing, and supports an arbitrary digital test flow, for smooth integration of embedded mixed-signal core circuits enabled within arbitrary SoC environments and hierarchical levels. The testing architecture also incorporates a control mechanism that is configured for connection with a top-level IEEE 1149.1 JTAG controller.

FIG. 1A shows a circuit arrangement 100 with a testing circuit implemented with core data registers (CDRs), in accordance with another example embodiment of the present invention. Blocks WBR, 50, are Wrapper Boundary registers, CDR blocks 115 and 125 are Core Data Registers with testing functionality as described herein, and a wrapper bypass block WBY, 52, provides a bypass facility. All modes are controlled from a Wrapper Instruction Register (WIR), 51, while WBY and WBR are constructs in the IEEE 1500 architectural wrapper concept. Reference numeral 53 denotes a core. Reference numeral 54 denotes a scan chain. Reference numerals 55 and 56 denote multiplexers.

The signals wsi, wpi, wso and wpo are respectively wrapper serial input, wrapper parallel input, wrapper serial output and wrapper parallel output. The CaptureWR, ShiftWR and UpdateWR are signals generated by a top level controller. The signal wrck is a test clock signal, and wrstn is a reset signal of the test shell, originating from a top-level controller. Such a top-level controller may, for example, be a JTAG TAP controller where signals are sent to IEEE 1500 test shells (see, e.g., IEEE Std. 1149.1-2001, "IEEE Standard Test Access Port and Boundary-Scan Architecture", IEEE Computer Society), or may be an I2C bus controller (see, e.g., the I2C standard available from NXP Semiconductors of Eindhoven, The Netherlands (see, e.g., version 3.0, June 2007). Both of these JTAG and I2C documents are fully incorporated herein by reference.

The CDR blocks 115, 125 include circuitry configured for mixed-signal testing, which may be implemented, for example, in accordance with G. Seuren, T. Waayers, "Extending the Digital Core-Based Test Methodology to Support Mixed-Signal," *Proc. of IEEE International Test Conference* (*ITC*), October 2004, paper no 10.4; and V. A. Zivkovic, J. Schat, G. Seuren, F. van der Heyden, "A Generic Infrastructure for Testing SoC's with Mixed-Signal/RF Modules," *Proc. of* 12-*th IEEE International Mixed Signal Testing Workshop* (*IMSTW*), 21-23 Jun. 2006, Edinburgh, UK, pp. 90-95. Both of these mixed-signal based references are fully incorporated herein by reference. As discussed in the following, this test-based CDR is referred to as the Test Point Register (TPR).

Figure 1B:
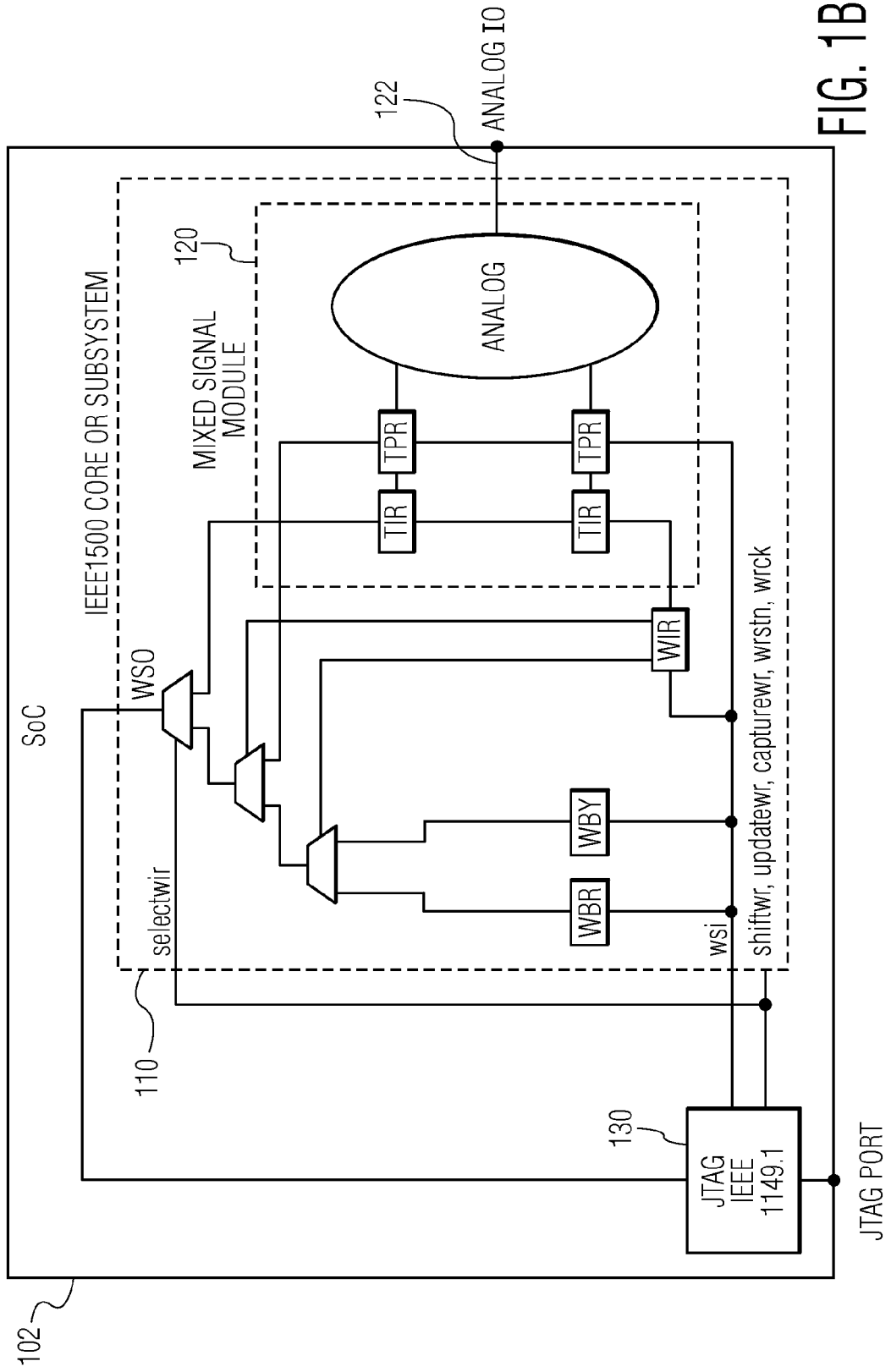
FIG. 1B shows an integrated circuit chip with a testing circuit, in accordance with an example embodiment of the present invention.

FIG. 1B shows a system-on-chip (SoC) integrated circuit chip 102 with a testing circuit, including a mixed signal module 120 having multiple TPRs (two shown), in accordance with another example embodiment of the present invention. The SoC 102 may be implemented in connection with an arrangement similar to arrangement 100 of FIG. 1A.

In some implementations, the SoC includes a JTAG (IEEE 1149.1) TAP Port 130 with a JTAG TAP controller configured to control a diversity of on chip test hardware 110, represented by way of example as IEEE 1500 Cores or subsystems with an IEEE 1500-compliant wrapper.

Various methods that may be used to control IEEE 1500 hardware from an IEEE 1149.1 TAP, as can be implemented herein, are described in an appendix of the IEEE 1500 standard as referenced above. For instance, one TPR can be used for controlling digital signals to and from analog circuitry, while another TPR is used to control an observe signal generation and post processing hardware in a mixed signal module.

The TPR registers are daisy-chained to form a Core Data Register that can be selected through a dedicated WIR instruction. In some implementations, each TPR register has a dedicated TIR register (test instruction register) that selects the operating mode of the TPR. These TIRs are also daisy-chained and then connected in series with the WIR of an IEEE 1500 wrapper, such that the contents of the TIR can be selected along with the test instruction in the IEEE 1500 WIR.

Figure 2:
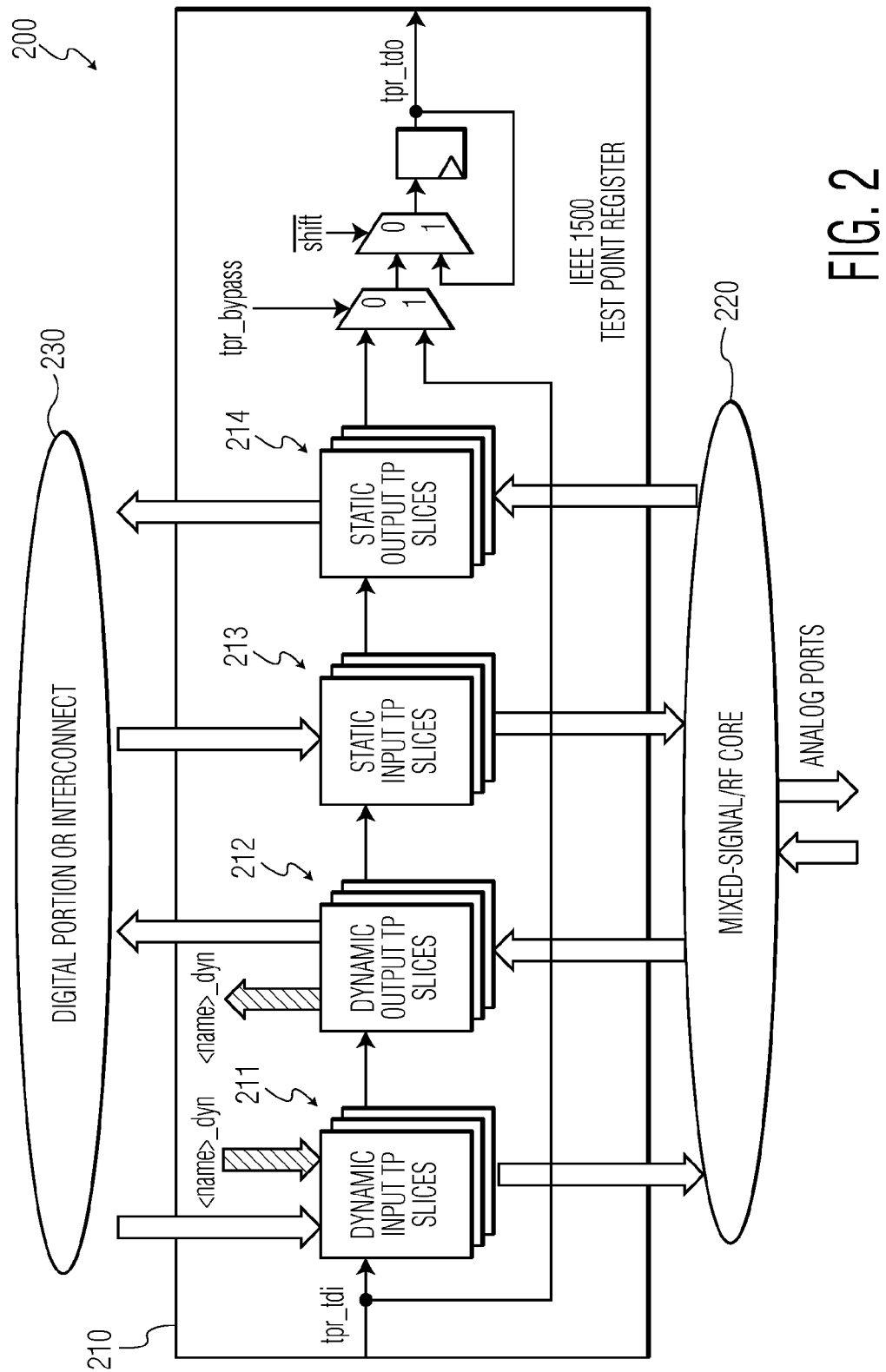
FIG. 2 shows a test-point register (TPR), in accordance with another example embodiment of the present invention.

FIG. 2 shows an example TPR 200, according to another example embodiment. The TPR 200 may, for example, be implemented in connection with one or more embodiments described herein, such as those shown in and described in connection with FIG. 1B. The TPR 200 communicates with a mixed signal/RF core 220 with analog ports, and with a digital signal or interconnect portion 230 of the circuit upon which the TPR is implemented.

The TPR 200 includes a plurality of dynamic slice circuits (211, 212) and static slice circuits (213, and 214), that pass input test data (tpr_tdi) as received by dynamic input TP slice circuit 211. The dynamic slice circuits 211 and 212 may be omitted, in connection with certain embodiments.

A bypass multiplexer receives the output from the slice circuits and also receives the input test data, and a shift multiplexer receives one of the received inputs as passed by the bypass multiplexer in response to a bypass signal (tpr_bypass). The bypass multiplexer effectively operates to bypass the slice circuits 211-214, in response to the bypass signal (tpr_bypass), by directly passing the input test data (tpr_tdi). The shift multiplexer may, for example, operate in response to an inverted shift signal coming directly from a top-level controller, such as a JTAG controller.

A flip-flop receives the output of the shift multiplexer, and provides a feedback loop to an input of the shift multiplexer, as well as output test data (tpr_tdo) as an output of the TPR 200. Accordingly, multiple scan chains can be passed through the structure.

The TPR 200 is configured to operate in static, dynamic and bypass mode. In static mode, the TPR is configured as a shift and update register providing serial access to all the digital inputs and outputs of the mixed-signal IP through tpr_tdi/tpr_tdo.

In dynamic mode, the TPR is configured for dynamic access, enabling direct connection to the input and output ports of a mixed-signal IP through additional ports present at the boundary of the TPR 1500 register, such as represented by <name>_dyn as received via dynamic input/output slices 211 and 212.

In bypass mode, the TPR slices are skipped, which can facilitate management of test time, such as when the TPR 200 is chained to other TPRs when integrating several mixed-signal cores. The tpr_bypass signal is provided to the bypass multiplexer to effect bypass mode.

Figure 3A:
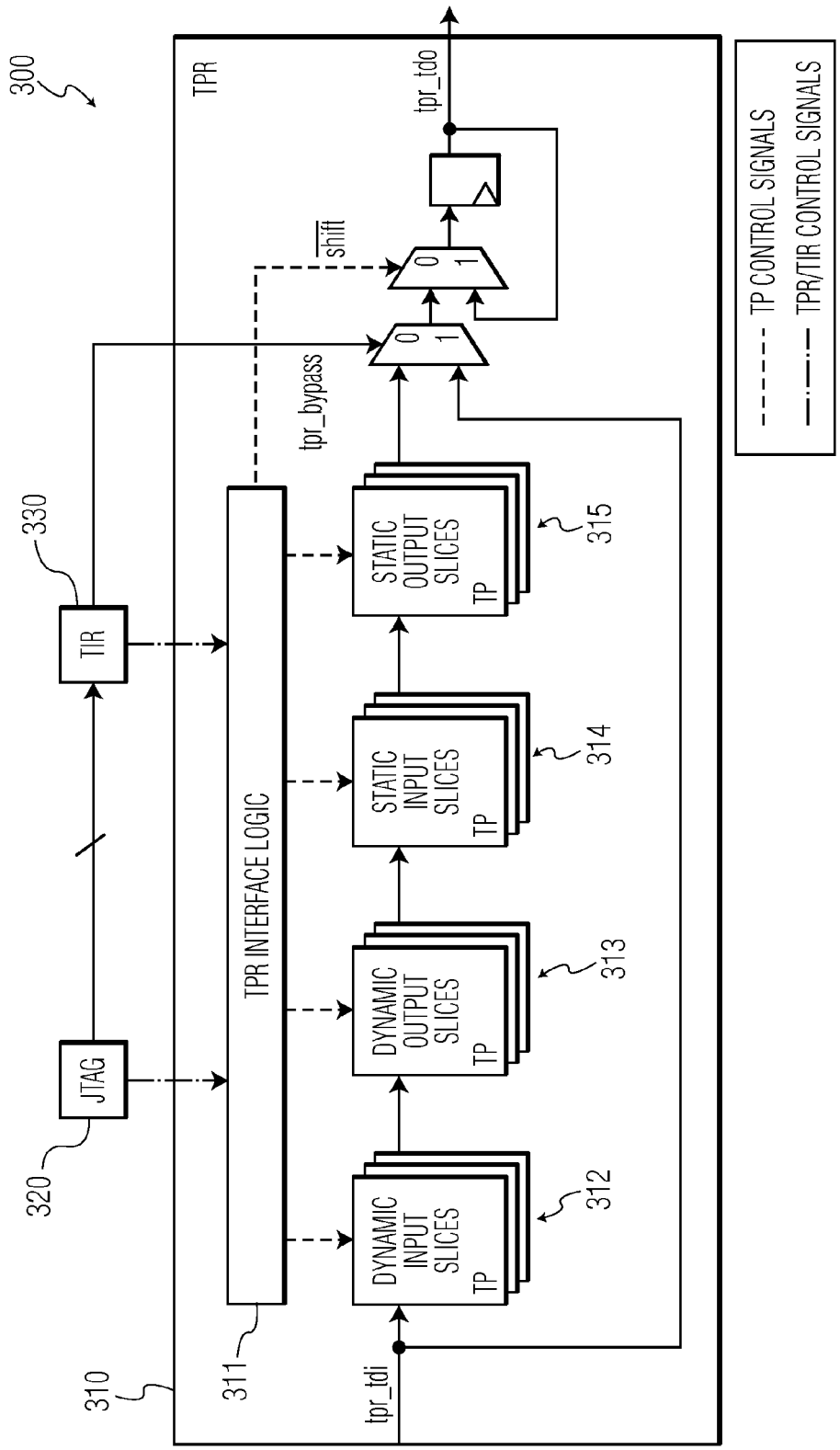
FIG. 3A shows a TPR with respective control signals, according to another example embodiment of the present invention.
Figure 3B:
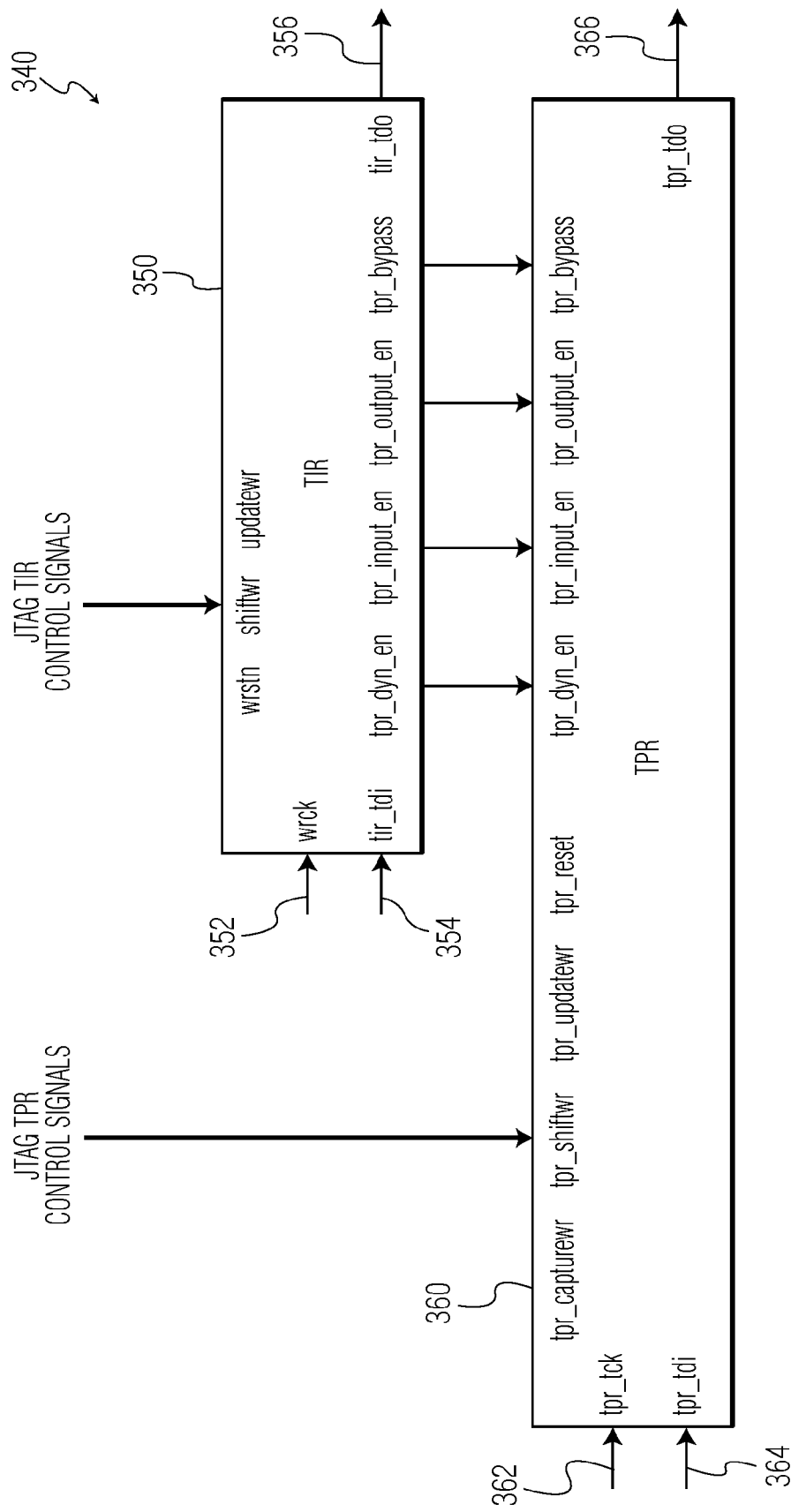
FIG. 3B is a block diagram showing test-point instruction register (TIR) and test-point register (TPR) communications, in accordance with another example embodiment of the present invention.

FIGS. 3A-3B respectively show a TPR with respective control signals, a block diagram for test-point instruction register (TIR) and test-point register (TPR) communications, and a TIR circuit, in accordance other example embodiments of the present invention, and as may be implemented together. FIG. 3A is similar to FIG. 2, with a TPR 310 receiving a test data input signal, selectively passing the signal via slice circuits 312, 313, 314 and 315, according to a bypass signal at a bypass multiplexer, and via a shift register, respectively operating as described above.

A (top-level) JTAG controller 320 provides control inputs to TPR interface logic 311 and to a TIR 330, which also provides inputs to the TPR interface logic and further provides a bypass signal to the bypass multiplexer.

Referring to FIG. 3B, detailed connections are made as shown between a controlling TIR 350 and a TPR 360, the former of which may be integrated with a wrapper instruction register (WIR) as discussed above. The components shown in FIG. 3B may, for example, be implemented with those shown in FIG. 3A (e.g., TPR 310 and TIR 330). The TIR 350 receives test clock (wrck) and test data input (tir_tdi) signals 352 and 354, provides a test data output signal 356 (tir_tdo), and provides outputs to the TPR 360 including the following outputs:

1) tpr_input_en

This TPR input enable signal enables input slices of the TPR. By default, the input TPR slice (circuit) is disabled to set the slice in transparent mode.

2) tpr_output_en

This TPR output enable signal enables the output slices of the TPR. By default, the output TPR slice (circuit) is disabled to set the slice in transparent mode.

3) tpr_dyn_en

This TPR dynamic enable signal enables the dynamic mode of the TPR(s) to which the signal is provided. By default, the dynamic mode is disabled.

4) tpr_bypass

This TPR bypass signal enables a bypass path from the TPR serial input to the TPR output port (e.g., as described above), and disables the shift, capture and update functionality. By default, bypass is disabled.

The TPR 360 receives clock (tpr_tck) and data (tpr_tdi) input signals 362 and 364, and outputs a test data output signal (tpr_tdo) 366. In some implementations, each TPR 360 has its private TIR 350, such that each TPR/TIR form a pair and can operate generally independently from other TPR/TIR pairs. With this approach, an arbitrary test configuration can be configured simultaneously during a mixed-signal test.

Figure 3C:
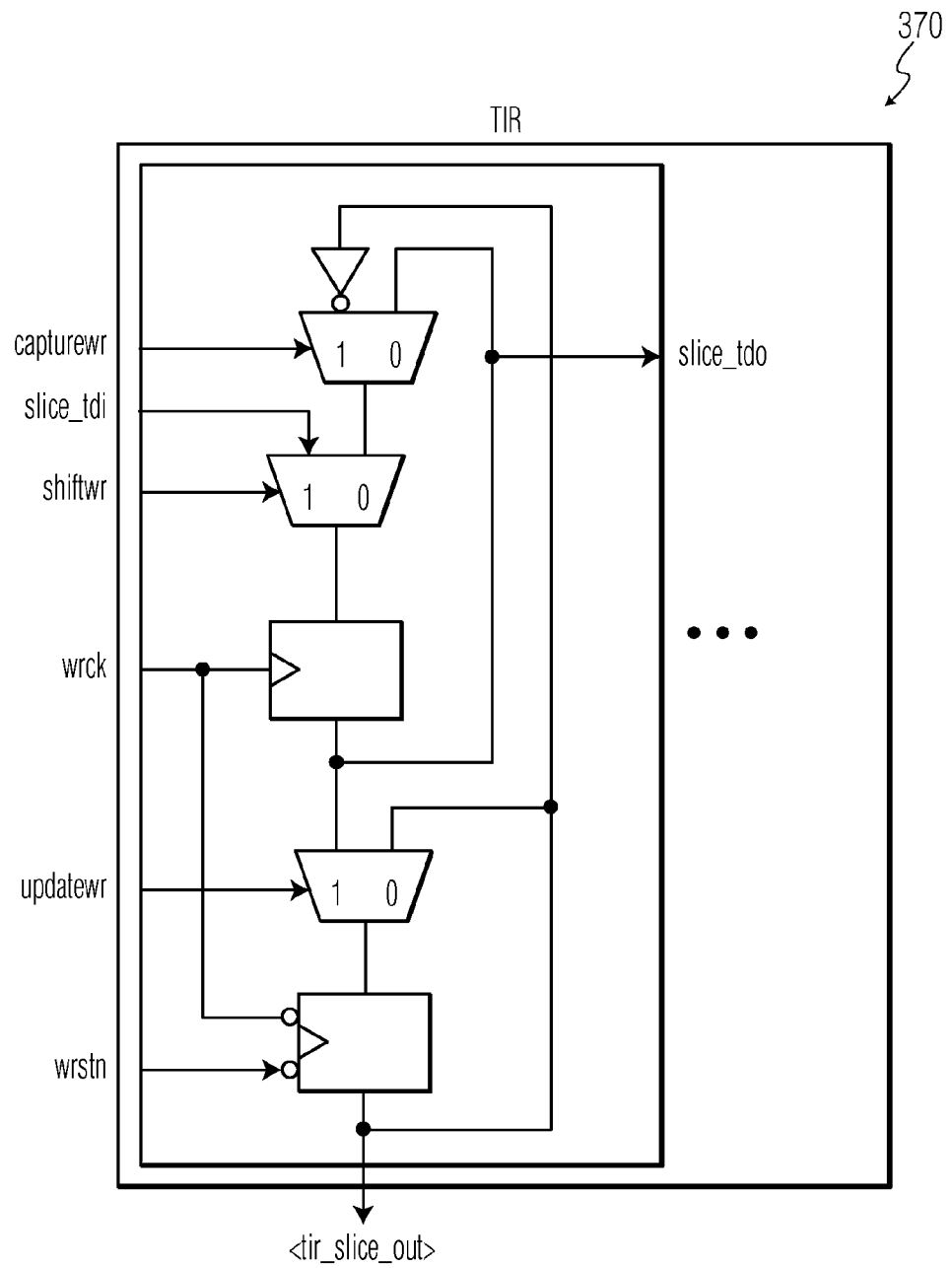
FIG. 3C shows a TIR, in accordance with another example embodiment of the present invention.

FIG. 3C shows a TIR 370, that includes four identical slices (circuits). The TIR 370 may, for example, be implemented with TIR 330 and/or TIR 350 of FIGS. 3A and 3B. Signals including capturewr, shiftwr, updatewr, wrstn and wrck signals come directly from the control port (e.g., an IEEE 1500 Wrapper Serial Control (WSC) port). The slice_tdi and slice_tdo signals are daisychained from tir_tdi to tir_tdo. The inverted path from tir_slice_out towards a capture register is configured to provide a self-test of the slice. The slice can be reset using the wrstn, capture and then shift out an all 1 pattern, and the output is updated and captured again to shift out an all 0 pattern.

Figure 4:
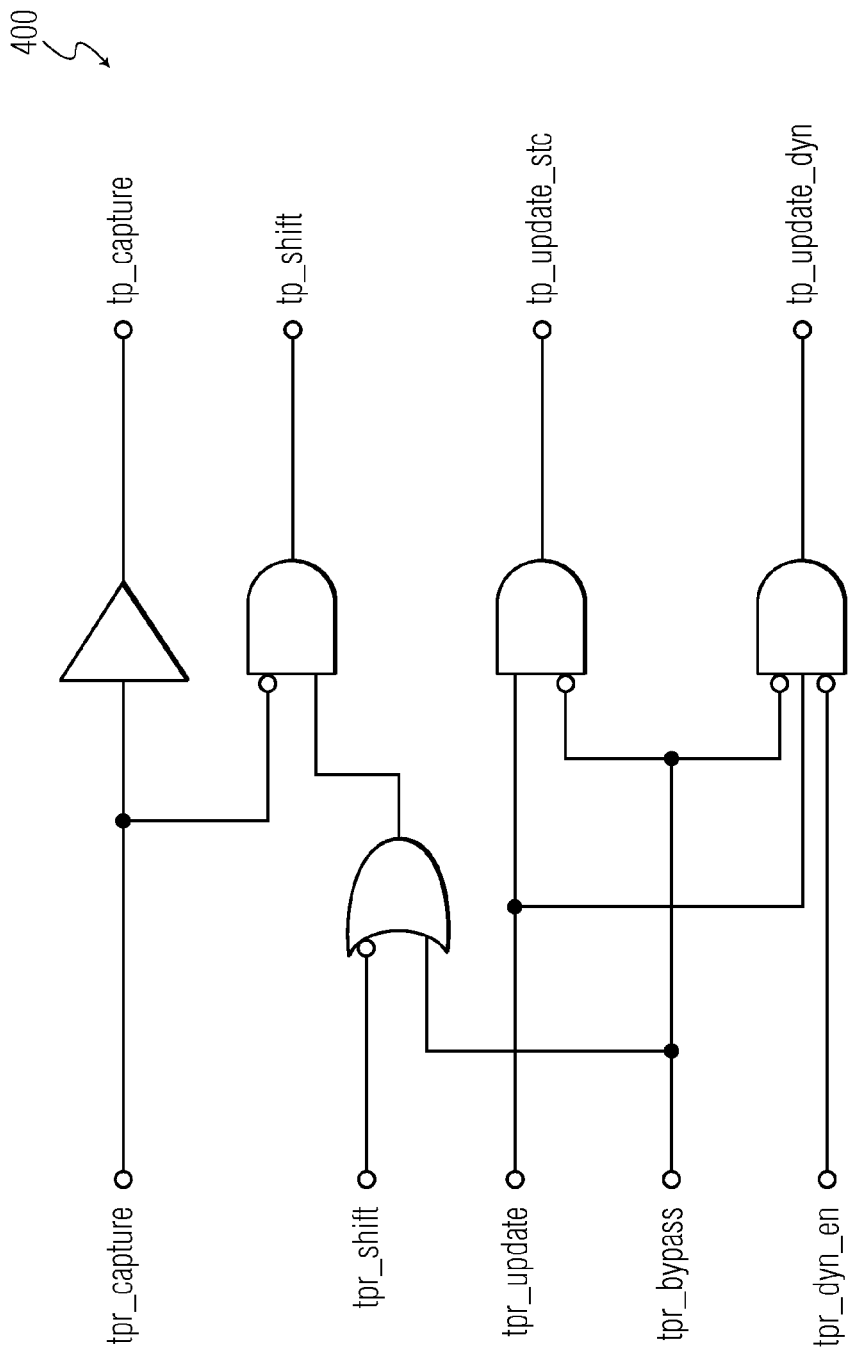
FIG. 4 shows a TPR interface logic circuit, according to another example embodiment of the present invention.

FIG. 4 shows a TPR interface (glue) logic circuit 400, according to another example embodiment of the present invention. Signals tpr_capture, tpr_shift, and tpr_update are top-level control signals, such as may be provided by a JTAG controller, as in accordance with IEEE 1500 cited above, and may be identical to signals that control a WIR. Signals as shown may, for example, be implemented in connection with one or more embodiments as described herein.

Figure 5:
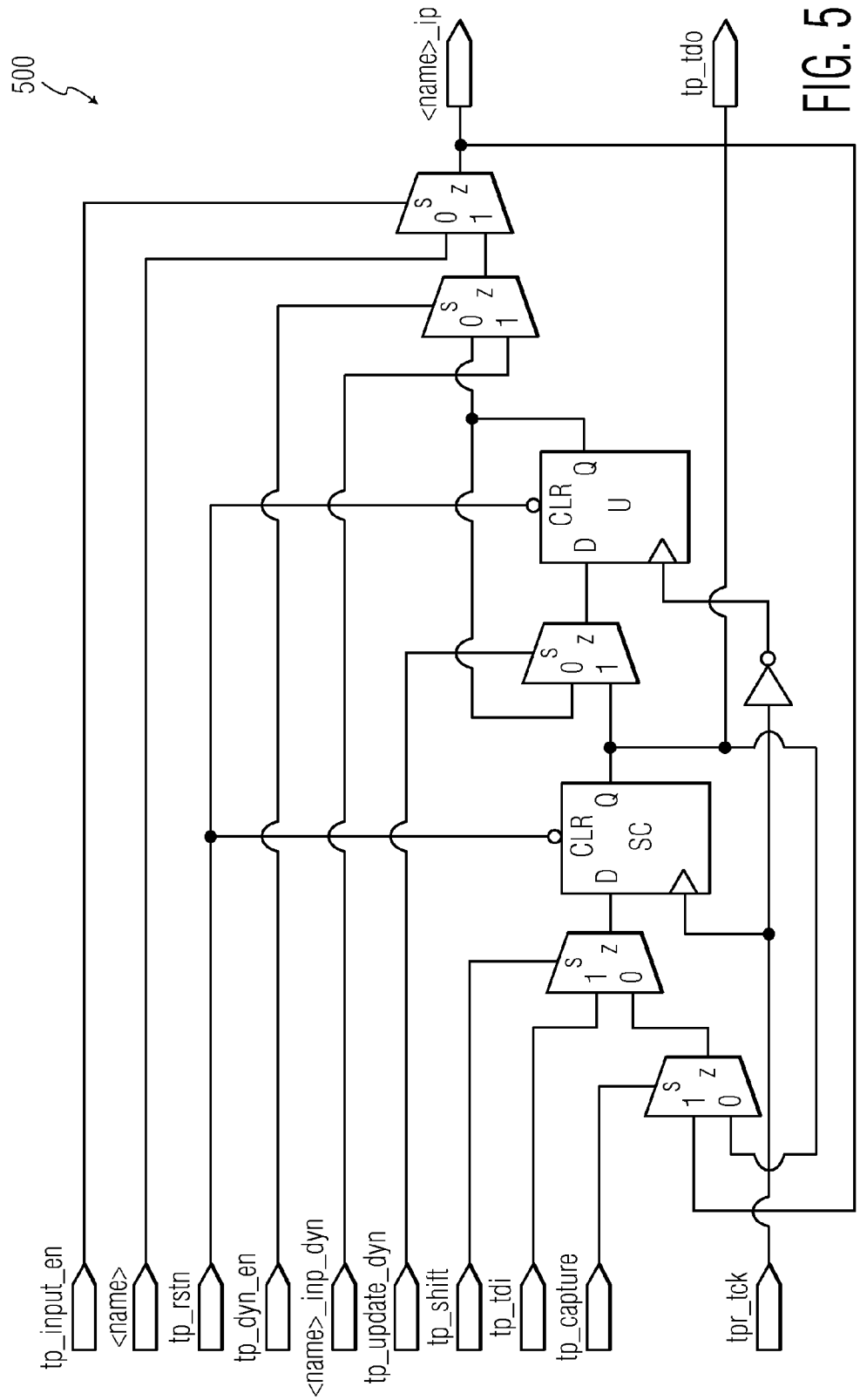
FIG. 5 shows a hardware implementation of a dynamic input slice for a TPR, according to another example embodiment of the present invention.

FIG. 5 shows a dynamic input slice circuit 500 for a TPR, according to another example embodiment of the present invention. The slice circuit 500 includes an update section that is clocked on a negative edge of the clock of a test shell (tpr_tck), while a shift (tp_shift) signal is used to control a multiplexer at the input (see, e.g., FIG. 2). The slice circuit 500 operates to facilitate mixed-signal test configurations for static, dynamic, and bypass operation as discussed herein. A digital scan-test may be implemented using a standard DfT insertion tool, where flip-flops in the TPR slices are able to be scanned and connected to an arbitrary number of scan chains, such a tool may be implemented with those available from one or more of Cadence, of San Jose, Calif., Mentor Graphics, of Wilsonville, Oreg., or Synopsys, of Mountain View, Calif. SC and U denote Shift/Capture and Update operations, as attributed to the flip-flops from shift and update sections of the TPR, respectively.

The tp_update_dyn, tp_shift and tp_capture ports of the slices, respectively, can be controlled through TPR glue logic via the mandatory ports in accordance with IEEE 1500 (e.g., operations of isolation cells as defined therein), such as UpdateWR, ShiftWR and CaptureWR, as illustrated in FIG. 4. Other signals are explained in the Table I, as may be implemented in various embodiments.

TABLE I

TPR 1500 DYNAMIC INPUT SLICE SIGNALS MAPPING

| TPR Signal | Description |
| --- | --- |
| tp_input_en | Connected to TIR tpr_input_en |
| <name> | IP functional input |
| tp_rstn | TPR reset signal, arbitrary implementation |
| tp_dyn_en | Connected to TIR tpr_dyn_en |
| <name>_inp_dyn | Test data signal for dynamic configuration |
| tp_tdi | TPR data input for static configuration |
| tpr_tck | Clock of the test shell |
| <name>_ip | TPR output, functional input to the IP |
| tp_tdo | TPR data output for static configuration |

Table II illustrates the various modes of the TPR input dynamic slice, together with their signal values, as may be implemented in connection with various embodiments. For instance, the Tables I and II may be implemented for communications between the TPR interface logic (from FIG. 4), the TPR, TIR, and a top-level controller (e.g., JTAG), where Capture/Shift/Hold/Update in the first column are standard JTAG modes, as described in IEEE Std. 1149.1-2001 as cited herein. These modes also enable static and bypass configuration. For dynamic configuration, an additional Direct mode is used as defined in the penultimate row of Table II.

TABLE II

DYNAMIC INPUT SLICE MODE DEFINITION

|  | tp_capture | tp_shift | tp_update | tp_input_en | tp_rstn | tp_dyn_en |
| --- | --- | --- | --- | --- | --- | --- |
| Capture | 1 | 0 | 0 | X | 1 | 0 |
| Shift | X | 1 | 0 | X | 1 | 0 |
| Hold | 0 | 0 | 0 | 1 | 1 | 0 |
| Update | 0 | 0 | 1 | 1 | 1 | 0 |

TABLE II-continued

DYNAMIC INPUT SLICE MODE DEFINITION

|  | tp_capture | tp_shift | tp_update | tp_input_en | tp_rstn | tp_dyn_en |
|---|---|---|---|---|---|---|
| Direct | X | X | X | X | 1 | 1 |
| Application | X | X | X | 0 | 0 | 0 |

Figure 6:
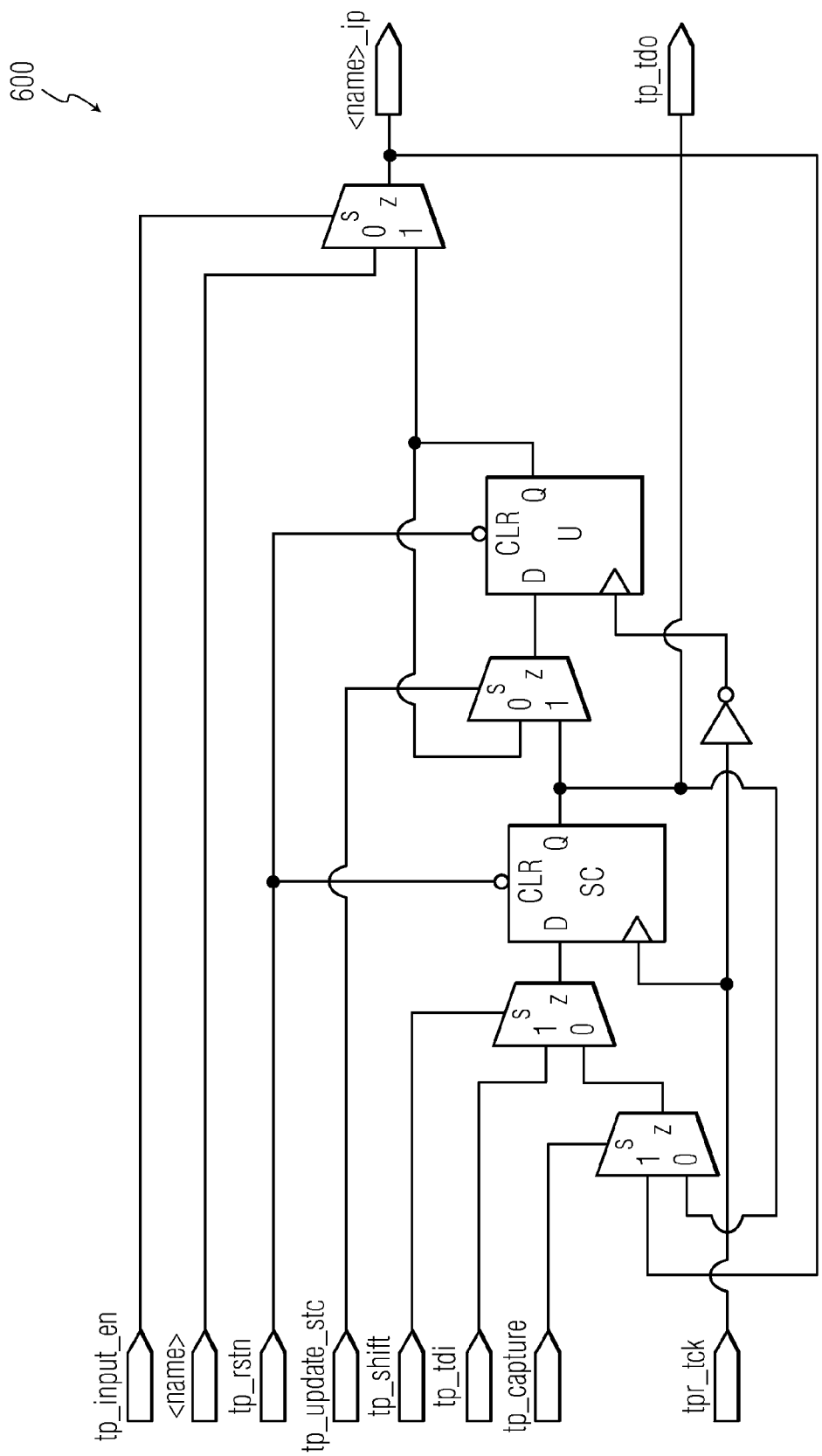
FIG. 6 shows a hardware implementation of a static input slice for a TPR, according to another example embodiment of the present invention.

FIG. 6 shows a static input slice circuit 600 for a TPR, according to another example embodiment of the present invention. Tables III and IV describe signals mapping and operation modes of the slice circuit 600. Similar to the dynamic input slice, the tp_update_stc, tp_shift and tp_capture ports of the slices are controlled through the TPR glue logic via ports in accordance with IEEE 1500 (e.g., UpdateWR, ShiftWR and CaptureWR), such as represented in FIG. 4.

TABLE III

TPR 1500 STATIC INPUT SLICE SIGNALS MAPPING

| TPR Signal | Description |
|---|---|
| tp_input_en | Connected to TIR tpr_input_en |
| <name> | IP functional input |
| tp_rstn | TPR reset signal, arbitrary implementation |
| tp_tdi | TPR data input for static configuration |
| tpr_tck | Clock of the test shell |
| <name>_ip | TPR output, functional input to the IP |
| tp_tdo | TPR data output for static configuration |

TABLE IV

STATIC INPUT SLICE MODE DEFINITION

|  | tp_capture | tp_shift | tp_update | tp_input_en | Tp_rstn |
|---|---|---|---|---|---|
| Capture | 1 | 0 | 0 | X | 1 |
| Shift | X | 1 | 0 | X | 1 |
| Hold | 0 | 0 | 0 | 1 | 1 |
| Update | 0 | 0 | 1 | 1 | 1 |
| Application | X | X | X | 0 | 0 |

Figure 7:
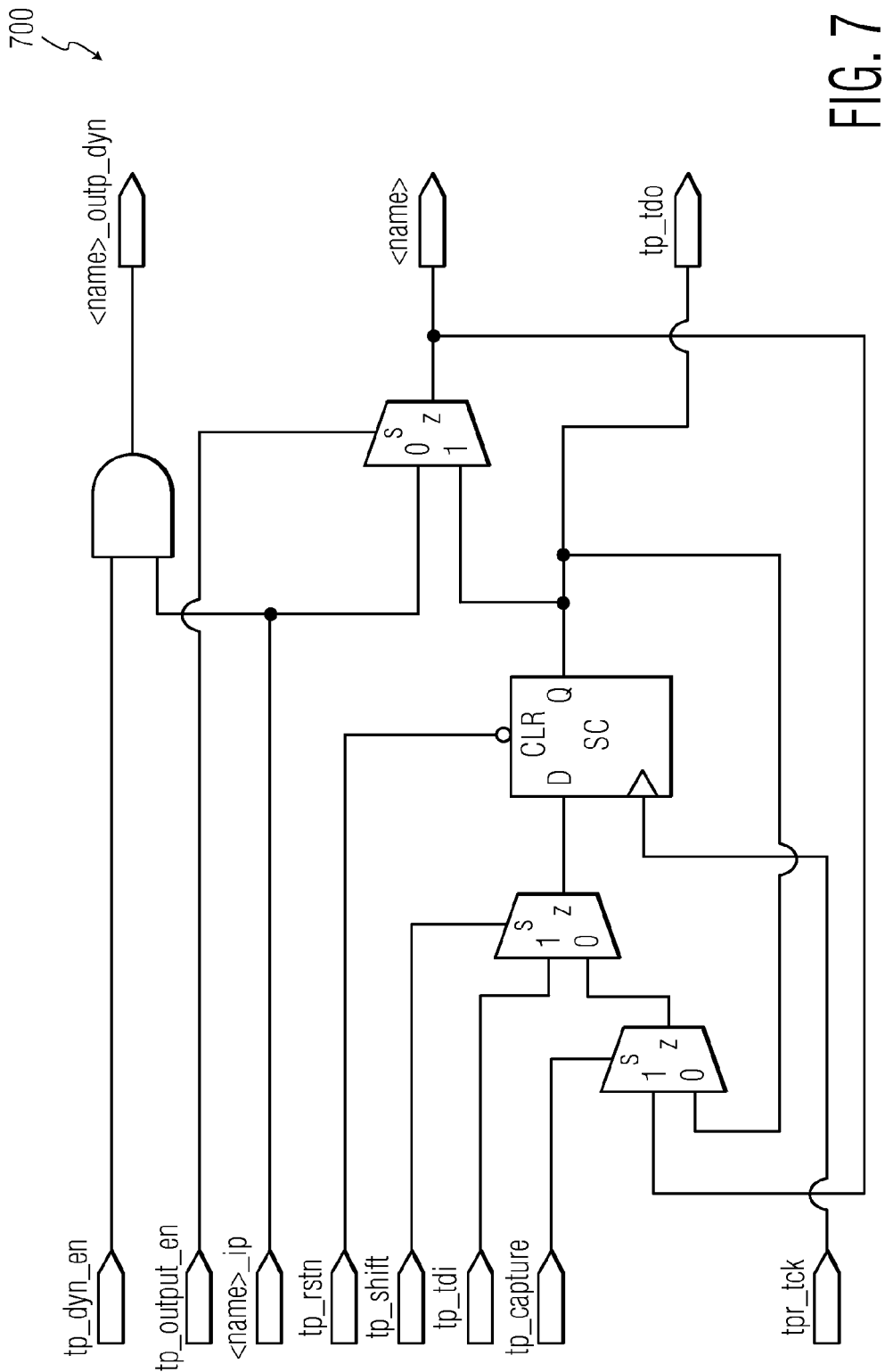
FIG. 7 shows a hardware implementation of a dynamic output slice for a TPR, according to another example embodiment of the present invention.

FIG. 7 shows a dynamic output slice circuit 700 for a TPR, according to another example embodiment of the present invention. Tables V and VI show signals mapping and operation modes of the TPR dynamic output slice circuit 700.

TABLE V

TPR 1500 DYNAMIC OUTPUT SLICE SIGNALS MAPPING

| TPR Signal | Description |
|---|---|
| tp_output_en | Connected to TIR tpr_output_en |
| <name> | IP functional output |
| tp_rstn | TPR reset signal, arbitrary implementation |
| tp_dyn_en | Connected to TIR tpr_dyn_en |
| <name>_outp_dyn | Test data response signal for dynamic configuration |
| tp_tdi | TPR data input for static configuration |
| tpr_tck | Clock of the test shell |
| <name>_ip | TPR input, functional output of the IP |
| tp_tdo | TPR data output for static configuration |

TABLE VI

DYNAMIC OUTPUT SLICE MODE DEFINITION

|  | tp_capture | tp_shift | tp_output_en | tp_rstn | Tp_dyn_en |
|---|---|---|---|---|---|
| Capture | 1 | 0 | 0 | 1 | 0 |
| Shift | X | 1 | 0 | 1 | 0 |
| Hold | 0 | 0 | 1 | 1 | 0 |
| Direct | X | X | X | 1 | 1 |
| Application | X | X | 0 | 0 | 0 |

Figure 8:
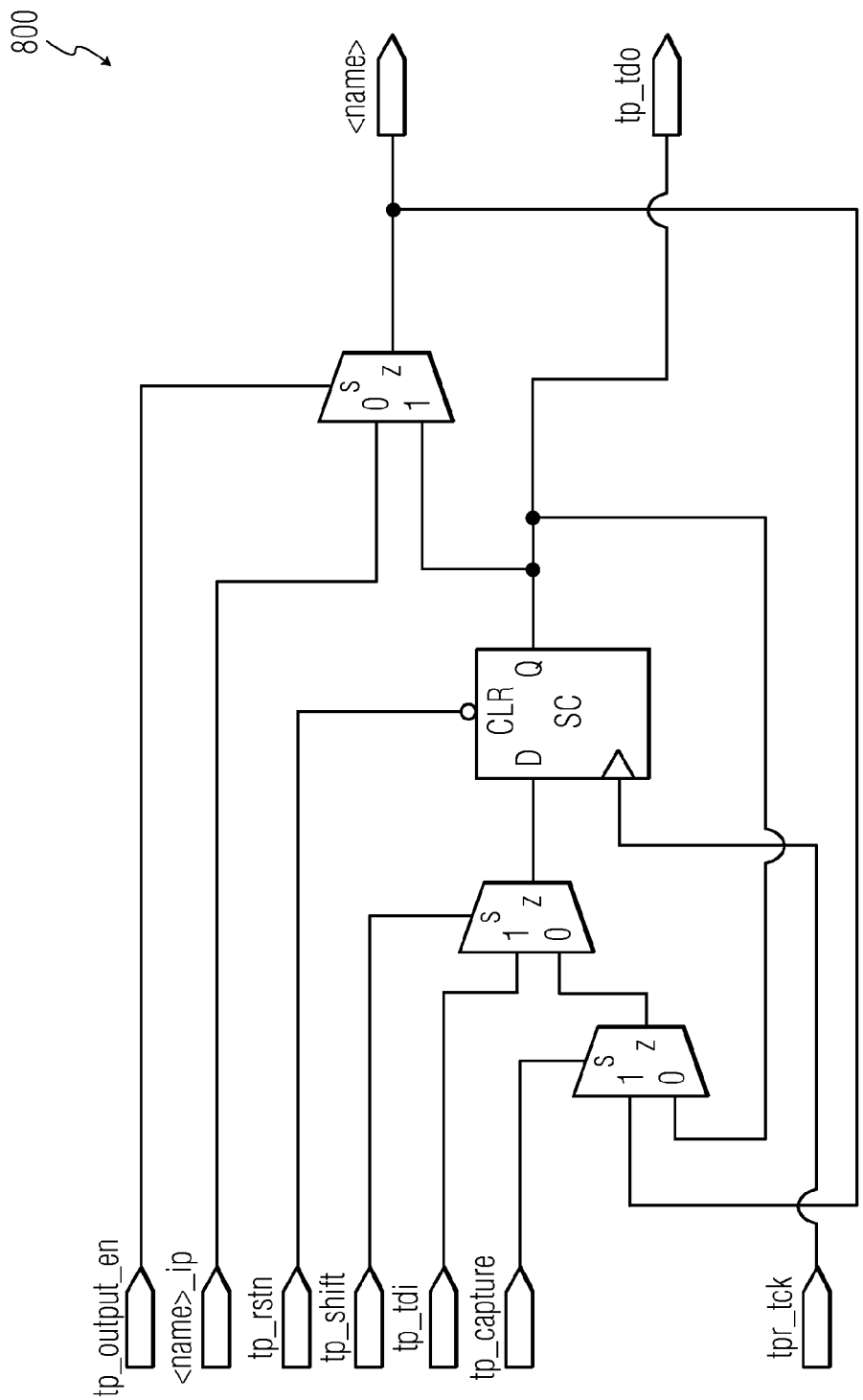
FIG. 8 shows a hardware implementation of a static input slice for a TPR with signal mapping test modes as discussed herein, according to another example embodiment of the present invention.

FIG. 8 shows a static input slice circuit 800 for a TPR with signal mapping test modes as discussed herein, according to another example embodiment of the present invention. The circuit 800 can be implemented with signal mapping test modes as illustrated in Tables VII and VIII.

TABLE VII

TPR 1500 STATIC OUTPUT SLICE SIGNALS MAPPING

| TPR Signal | Description |
|---|---|
| tp_output_en | Connected to TIR tpr_output_en |
| <name> | IP functional output |
| tp_rstn | TPR reset signal, arbitrary implementation |
| tp_tdi | TPR data input for static configuration |
| tpr_tck | Clock of the test shell |
| <name>_ip | TPR input, functional output of the IP |
| tp_tdo | TPR data output for static configuration |

TABLE VIII

STATIC OUTPUT SLICE MODE DEFINITION

|  | tp_capture | tp_shift | tp_output_en | tp_rstn |
|---|---|---|---|---|
| Capture | 1 | 0 | 0 | 1 |
| Shift | X | 1 | 0 | 1 |
| Hold | 0 | 0 | 1 | 1 |
| Application | X | X | 0 | 0 |

Other embodiments are directed to design-for-test applications such as those described in J. Verfullie, D. Haspelslagh, "A General-Purpose Design-for-Test Methodology at the Analog-Digital Boundary of Mixed-Signal VLSI," *Journal of Electronic Testing Theory and Application*, Vol. 9, 1996, pp. 109-115; or to analog wrapper-based testing of SoC designs with mixed-signal blocks as described in A. Sehgal et al, "Test Planning for Mixed-Signal SoCs with Wrapped Analogue Cores," *Proc. of IEEE Conference on Design, Automation and Test in Europe (DATE)* 2005, pp. 50-55. For example, certain testing signals as applied in accordance with various embodiments may be implemented in accordance with aspects of the testing approaches described within these references. Accordingly, both of these references are fully incorporated by reference.

The various embodiments as discussed herein may be implemented using a variety of structures and related operations/functions. For instance, one or more embodiments as described herein may be computer-implemented or computer-assisted, as by being coded as software within a coding system as memory-based codes or instructions executed by a computer processor, microprocessor, PC or mainframe computer. Such computer-based implementations are implemented using one or more programmable or programmed circuits that include at least one computer-processor and internal/external memory and/or registers for data retention and access. One or more embodiments may also be implemented in various other forms of hardware such as a state machine, programmed into a circuit such as a field-programmable gate array, implemented using electronic circuits such as digital or analog circuits. In addition, various embodiments may be implemented using a tangible storage medium that stores instructions that, when executed by a processor, performs one or more of the steps, methods or processes described herein. These applications and embodiments may also be used in combination; for instance certain functions can be implemented using discrete logic (e.g., a digital circuit) that generates an output that is provided as an input to a processor.

Based upon the above discussion and illustrations, those skilled in the art will readily recognize that various modifications and changes may be made to the present invention without strictly following the exemplary embodiments and applications illustrated and described herein. Such modifications and changes may include, for example, using different mixed signals, operating different designs with common test signals, or with different test signals as described, using additional or fewer circuits and/or steps to effect test approaches as described, and others. These and other modifications do not depart from the true spirit and scope of the present invention, including that set forth in the following claims.

What is claimed is:

1. A test interface circuit for operation with different types of core circuits, the test interface circuit comprising:
   an input port configured to receive test input signals;
   a test input register (TIR) configured to select an operating mode; and
   a plurality of test point registers (TPRs), each TPR configured to control signals passed from the input port to a mixed-signal core circuit, responsive to the received test input signals and the operating mode selected by a TIR, by
      in a static mode, providing serial access to digital inputs and outputs of a mixed-signal core circuit, and
      in a bypass mode, bypassing TPR slices to preserve test time in response to the TPR being chained to other ones of the TPRs during integration of at least two mixed-signal core circuits.

2. The circuit of claim 1, wherein each of the TPRs is configured to control signals passed to the mixed-signal core circuit in a dynamic mode, responsive to the received test input signals and the operating mode selected by the TIR, by providing dynamic access to connect the input and output ports of the mixed-signal core circuit through additional ports at a boundary of the TPR.

3. The circuit of claim 2, wherein the TIR is configured to select an operating mode of the TPR by
   providing a TPR input enable signal that enables input slices of the TPR,
   providing a TPR output enable signal that enables the output slices of the TPR,
   providing a TPR dynamic mode enable signal that enables the dynamic mode of the TPR, and
   providing a TPR bypass signal that enables a bypass path from a TPR serial input to an output port and disables shift, capture and update functionality of the TPR.

4. The circuit of claim 2, wherein the TIR is configured to select an operating mode of the TPR by
   providing a TPR input enable signal that enables input slices of the TPR, wherein the TPR input enable signal is disabled by default for a transparent mode,
   providing a TPR output enable signal that enables the output slices of the TPR, wherein the TPR output enable signal is disabled by default for a transparent mode,
   providing a TPR dynamic mode enable signal that enables the dynamic mode of the TPR, wherein the dynamic mode enable signal is disabled by default, and
   providing a TPR bypass signal that enables a bypass path from a TPR serial input to an output port and disables shift, capture and update functionality of the TPR, wherein the TPR bypass signal is disabled by default.

5. The circuit of claim 1, wherein the TIR is configured to select an operating mode of the TPR by
   providing a TPR input enable signal that enables input slices of the TPR,
   providing a TPR output enable signal that enables the output slices of the TPR, and
   providing a TPR bypass signal that enables a bypass path from a TPR serial input to an output port and disables shift, capture and update functionality of the TPR.

6. The circuit of claim 1, wherein the TIR is configured to select an operating mode of the TPR by
   providing a TPR input enable signal that enables input slices of the TPR, wherein the TPR input enable signal is disabled by default for a transparent mode,
   providing a TPR output enable signal that enables the output slices of the TPR, wherein the TPR output enable signal is disabled by default for a transparent mode, and
   providing a TPR bypass signal that enables a bypass path from a TPR serial input to an output port and disables shift, capture and update functionality of the TPR, wherein the TPR bypass signal is disabled by default.

7. The circuit of claim 1, wherein
   the input port is configured to receive JTAG test input signals,
   the TIR is configured to select an operating mode by selecting a JTAG operating mode, and
   at least one of the TPRs is configured to control signals passed to a mixed-signal core circuit, responsive to the JTAG test input signals.

8. The circuit of claim 1, wherein the TPRs are configured and arranged to operate in response to a common clock signal.

9. The circuit of claim 1,
   further including a plurality of additional TIRs configured to select an operating mode,
   wherein each TIR is paired with a single one of the TPRs, and
   wherein each TIR is configured to select an operating mode for the TPR to which the TIR is paired, and each TPR is responsive to the test input signals received exclusively from the TIR to which the TPR is paired.

10. The circuit of claim 1,
   further including a plurality of additional TIRs configured to select an operating mode,
   wherein each TIR is paired with a single one of the TPRs,
   wherein each TIR is configured to select an operating mode for the TPR to which the TIR is paired, and each TPR is responsive to the test input signals received exclusively from the TIR to which the TPR is paired, and wherein different ones of the TIRs are configured to select operating modes that are different than operating modes selected by other ones of the TIRs, to control different ones of the respectively-paired TPRs to simultaneously operate under different test conditions.

11. The circuit of claim 1, wherein the TPRs include a bypass circuit that is configured to operate, when the TPR is in a bypass mode, in response to an inverted shift signal received via the test input port.

12. The circuit of claim 1, wherein the TPRs include a logic circuit configured and arranged to operate in accordance with IEEE1500 and to generate control signals that are common for each type of core circuit.

13. The circuit of claim 1, wherein the TIR is part of a circuit that provides test input signals to the input port, and controls the operating mode of the TPRs via the input port.

14. The circuit of claim 1, wherein the TPRs are configured to control signals including test signals according to at least one of IEEE1500 and IEEE1149.1.

15. A test point register circuit comprising,
an input dynamic slice circuit that receives a test input signal;
an output dynamic slice circuit coupled to receive an output of the input dynamic slice circuit;
an input static slice circuit coupled to receive an output of the output dynamic slice circuit;
an output static slice circuit coupled to receive an output of the input static slice circuit;
a bypass multiplexer coupled to receive the test input signal and an output of the output static slice circuit as inputs, and configured to selectively pass one of the inputs in response to a bypass control signal;
a shift multiplexer coupled to receive an output of the bypass multiplexer and a test data output of the test point register as inputs, and to selectively pass one of the inputs in response to a shift control signal; and
a flip flop coupled to receive an output of the shift multiplexer, to provide an output of the test point register circuit, and to provide the output as a feedback input to the shift multiplexer.

16. The circuit of claim 15, wherein the bypass and shift multiplexers are respectively configured to selectively pass inputs in response to control signals received from a top-level controller circuit.

17. The circuit of claim 15, wherein the input dynamic slice circuit and the output dynamic slice circuit are configured to selectively operate in response to a dynamic mode enable signal, wherein the test point register operates in a static mode when the dynamic input and output slice circuits are not enabled.

18. The circuit of claim 15, wherein the test point register circuit is configured to operate in response to
an input enable signal by enabling input slice circuits, and to operate in transparent mode absent the input enable signal,
an output enable signal by enabling output slice circuits, and to operate in transparent mode absent the output enable signal,
a dynamic mode enable signal by operating dynamic slice circuits, and to operate in a static mode absent the dynamic mode enable signal, and
a bypass mode enable signal by operating in a bypass mode to pass received input signals to an output, and by operating the slice circuits absent the bypass mode enable signal.

19. The circuit of claim 15, wherein the respective slice circuits are configured to receive test signals and communicate to provide access to a mixed-signal core circuit in compliance with at least one of IEEE1500 and IEEE1149.1.

* * * * *